(12) United States Patent
Kawasaki

(10) Patent No.: US 10,931,258 B2
(45) Date of Patent: Feb. 23, 2021

(54) ELECTRONIC DEVICE AND MODULE INCLUDING THE SAME

(71) Applicant: Murata Manufacturing Co., Ltd., Nagaokakyo (JP)

(72) Inventor: Koichiro Kawasaki, Nagaokakyo (JP)

(73) Assignee: MURATA MANUFACTURING CO., LTD.', Kyoto (JP)

( * ) Notice: Subject to any disclaimer, the term of this patent is extended or adjusted under 35 U.S.C. 154(b) by 0 days.

(21) Appl. No.: 16/669,553

(22) Filed: Oct. 31, 2019

(65) Prior Publication Data

US 2020/0067481 A1    Feb. 27, 2020

Related U.S. Application Data

(63) Continuation of application No. PCT/JP2018/018080, filed on May 10, 2018.

(30) Foreign Application Priority Data

May 26, 2017 (JP) .............................. JP2017-104823

(51) Int. Cl.
*H03H 9/10* (2006.01)
*H03H 9/02* (2006.01)
(Continued)

(52) U.S. Cl.
CPC .......... *H03H 9/1092* (2013.01); *H01L 23/02* (2013.01); *H01L 23/04* (2013.01);
(Continued)

(58) Field of Classification Search
CPC .......... H03H 9/02984; H03H 9/02897; H03H 9/02937; H03H 9/059; H03H 9/1092;
(Continued)

(56) References Cited

U.S. PATENT DOCUMENTS 9,099,634 B2 * 8/2015 Inoue ................... H03H 9/1092
2005/0012187 A1 1/2005 Kameyama et al.
2011/0115339 A1 5/2011 Makibuchi et al.

FOREIGN PATENT DOCUMENTS

JP    2001-244785 A    9/2001
JP     2003-7501 A     1/2003
(Continued)

OTHER PUBLICATIONS

Official Communication issued in International Patent Application No. PCT/JP2018/018080 dated Jul. 31, 2018.

*Primary Examiner* — Robert J Pascal
*Assistant Examiner* — Jorge L Salazar, Jr.
(74) *Attorney, Agent, or Firm* — Keating & Bennett, LLP

(57) ABSTRACT

An electronic device includes a support layer is provided on a piezoelectric substrate and surrounds a functional element. A cover layer is located above the support layer, and faces the piezoelectric substrate. A protective layer seals the support layer and the cover layer. The support layer is provided on at least the outer periphery of the piezoelectric substrate, and defines a hollow portion within the outer periphery of the piezoelectric substrate. The protective layer includes a first portion above the hollow portion, a second portion above the support layer, and a curved surface that is convex in an opposite direction from the piezoelectric substrate.

19 Claims, 13 Drawing Sheets

(51) Int. Cl.
  *H03H 9/05* (2006.01)
  *H03H 9/25* (2006.01)
  *H03H 9/64* (2006.01)
  *H01L 23/02* (2006.01)
  *H01L 23/04* (2006.01)
(52) U.S. Cl.
  CPC .... *H03H 9/02897* (2013.01); *H03H 9/02937* (2013.01); *H03H 9/02984* (2013.01); *H03H 9/059* (2013.01); *H03H 9/1071* (2013.01); *H03H 9/25* (2013.01); *H03H 9/6483* (2013.01)
(58) Field of Classification Search
  CPC ...... H03H 9/25; H03H 9/6483; H03H 9/1071; H01L 23/02; H01L 23/04
  USPC .................. 333/133, 187, 188, 193–196
  See application file for complete search history.

(56) References Cited

FOREIGN PATENT DOCUMENTS

| | | |
|---|---|---|
| JP | 2005-38927 A | 2/2005 |
| JP | 2006-345075 A | 12/2006 |
| WO | 2009/157587 A1 | 12/2009 |

\* cited by examiner ure that is greatest at

ELECTRONIC DEVICE AND MODULE INCLUDING THE SAME

CROSS REFERENCE TO RELATED APPLICATIONS

This application claims the benefit of priority to Japanese Patent Application No. 2017-104823 filed on May 26, 2017 and is a Continuation Application of PCT Application No. PCT/JP2018/018080 filed on May 10, 2018. The entire contents of each application are hereby incorporated herein by reference.

BACKGROUND OF THE INVENTION

1. Field of the Invention

The present invention relates to an electronic device and a module including the same.

2. Description of the Related Art

In recent years, wafer level package (hereinafter, simply referred to as WLP) electronic devices have been developed, which are element size packages.

For example, Japanese Patent Laid-Open No. 2006-345075 discloses a surface acoustic wave resonator device which includes interdigitated electrodes on a piezoelectric substrate, a gap forming layer having a gap formed therein above the interdigitated electrodes, and a sealing layer sealing the interdigitated electrodes. In Japanese Patent Laid-Open No. 2006-345075, a conductive via and an external connection electrode are formed so that the conductive via passes through the sealing layer and the gap forming layer and is connected to the interdigitated electrodes; and the external connection electrode continues the conductive via. Then, the conductive via and the external connection electrode are covered with a solder resist, a portion of the solder resist is removed, and a solder bump is thereby formed.

The electronic device having the above configuration forms a module by mounting the solder bump on a circuit board so that the solder bump is in contact with the circuit board. However, if one of the electronic device and the circuit board is inclined when mounting the electronic device onto the circuit board, a surface of the solder resist comes into contact with the circuit board, and damage to the surface, such as cracks and chips may occur. In this case, the conductive via and the external connection electrode may undergo oxidation or corrosion resulting from the damage, and degradation in characteristics of the electronic device may result.

SUMMARY OF THE INVENTION

Preferred embodiments of the present invention provide electronic devices and modules each including the same which can reduce degradation in characteristics of the electronic devices.

An electronic device according to a preferred embodiment of the present invention includes a piezoelectric substrate; a functional element provided on the piezoelectric substrate; a support layer that surrounds the functional element; a cover layer provided on the support layer, the cover layer facing the piezoelectric substrate; and a protective layer sealing the support layer and the cover layer. The piezoelectric substrate, the support layer, and the cover layer define a hollow portion that accommodates the functional element. The support layer is provided on at least the outer periphery of the piezoelectric substrate, thus defining a hollow portion within the outer periphery of the piezoelectric substrate. The protective layer includes a first portion above the hollow portion and a second portion above the support layer. The protective layer further includes a curved surface that is convex in an opposite direction from the piezoelectric substrate. A distance in the thickness direction of the piezoelectric substrate, between the surface of the piezoelectric substrate and the surface of the protective layer, is greatest at a location where the second portion is adjacent to or in a vicinity of the first portion, and the distance is shortest at a location where the second portion is adjacent to or in a vicinity of an end portion of the piezoelectric substrate in the width direction.

Preferably, for example, the distance decreases toward the end portion of the piezoelectric substrate in the width direction.

Preferably, a maximum distance in the thickness direction, between the surface of the piezoelectric substrate and the surface of the protective layer in the first portion is greater than a maximum distance in the thickness direction, between the surface of the piezoelectric substrate and the surface of the protective layer in the second portion.

Preferably, the first portion of the protective layer includes a curved surface that is convex in the opposite direction from the piezoelectric substrate.

Preferably, a maximum distance t1, a maximum distance t2, and a minimum distance X satisfy a relational expression expressed as (t1−t2)<X, where t1 denotes the maximum distance in the thickness direction, between the surface of the cover layer and the surface of the protective layer in the first portion, t2 denotes the maximum distance in the thickness direction, between the surface of the cover layer and the surface of the protective layer in the second portion, and X denotes the minimum distance in the thickness direction, between a surface of the cover layer facing the hollow portion and the surface of the functional element in the hollow portion.

Preferably, the first portion of the protective layer includes a flat surface.

Preferably, the cover layer includes a curved portion that is convex in the opposite direction from the piezoelectric substrate.

Preferably, at the end portion of the piezoelectric substrate in the width direction, the protective layer includes a first curved portion which is convex in the opposite direction from the piezoelectric substrate; and a second curved portion which is concave in a direction to the piezoelectric substrate, the second curved portion being located between the first curved portion and the end surface of the piezoelectric substrate in the width direction.

Preferably, the end surface of the support layer in the width direction is located outward of the end surface of the protective layer in the width direction.

Preferably, the electronic device further includes a line provided on the piezoelectric substrate and connected to the functional element; and a connection electrode provided on the cover layer, the connection electrode extending to the piezoelectric substrate along the support layer and side surfaces of the cover layer, and connected to the line.

Preferably, the electronic device further includes a line provided on the piezoelectric substrate and connected to the functional element; and a penetrating electrode connected to the line, the penetrating electrode extending through the support layer and the cover layer.

Preferably, the electronic device further includes a line electrode provided between the first portion of the protective layer and the cover layer.

An electronic device according to a preferred embodiment of the present invention includes a circuit board including a line provided at least on a surface of the circuit board; and the electronic device is flip-chip mounted on the circuit board.

According to preferred embodiments of the present invention, the probability of causing damage to the protective layer is reduced, and consequently, degradation can be reduced in characteristics of the electronic device that results from the damage to the protective layer.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
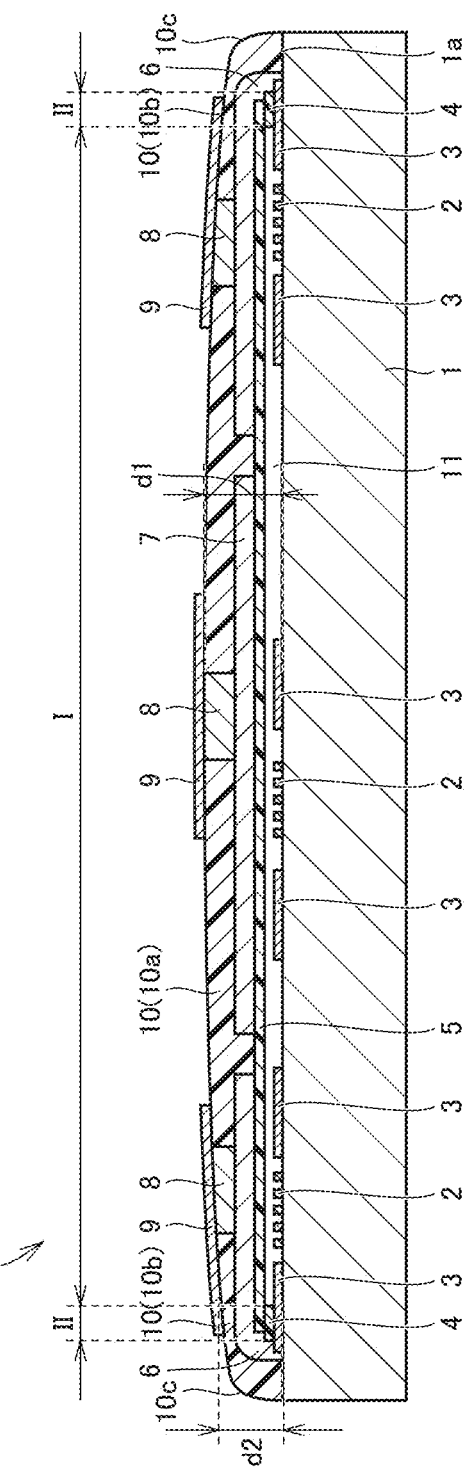
FIG. 1 is a cross-sectional view of a surface acoustic wave filter according to a first preferred embodiment of the present invention.

Hereinafter, preferred embodiments according to the present invention will be described with reference to the accompanying drawings. Note that the same reference signs are used to refer to the same or corresponding portions in the drawings, and description thereof will not be repeated.

Note that when the preferred embodiments described below refer to a number, a quantity, etc., the scope of the present invention is not always limited to that number, that quantity, etc., unless otherwise specified. In the following preferred embodiments, each device is also not essential to the present invention unless otherwise specified.

First Preferred Embodiment

An electronic device 100 according to a first preferred embodiment is applied to, for example, an RF circuit included in a communication device, such as a mobile phone. Electronic device 100 operates through sound waves. Examples of electronic device 100 include surface acoustic wave (SAW) devices, bulk acoustic wave (BAW) devices, and MEMS devices. In the first preferred embodiment, a surface acoustic wave filter will be shown and described as one preferred embodiment of electronic device 100. In the following, electronic device 100 will be also referred to as a "surface acoustic wave filter 100".

FIG. 1 is a cross-sectional view of surface acoustic wave filter 100 according to the first preferred embodiment of the present invention. Surface acoustic wave filter 100 is preferably, for example, a ladder filter in which multiple surface acoustic wave resonators are connected in a ladder arrangement. The surface acoustic wave resonator corresponds to one preferred embodiment of "the functional element" according to the present invention.

Referring to FIG. 1, surface acoustic wave filter 100 according to the first preferred embodiment includes a piezoelectric substrate 1, a surface acoustic wave resonator 2 (the functional element), a line 3, a support layer 4, a cover layer 5, a connection electrode 6, a line electrode 7, a pillar 8, an external connection terminal 9, and a protective layer 10.

Piezoelectric substrate 1 is preferably made of piezoelectric crystal, for example, lithium tantalate ($LiTaO_3$) or lithium niobate ($LiNbO_3$). Piezoelectric substrate 1 may be made of piezo ceramic or may be a substrate including a piezoelectric thin film on the primary surface. Piezoelectric substrate 1 has a cuboid shape, for example, and preferably has a rectangular or substantially rectangular shape in plan view in the thickness direction of piezoelectric substrate 1. Piezoelectric substrate 1 includes a primary surface 1a.

Surface acoustic wave resonator 2 and line 3 are provided on primary surface 1a of piezoelectric substrate 1. Surface acoustic wave resonator 2 includes a conductor layer provided on primary surface 1a, and includes a pair of interdigitated electrodes (hereinafter, also referred to as an "inter digital transducer (IDT) electrode"), the conductor layer preferably including aluminum (Al), copper (Cu), nickel (Ni), gold (Au), or platinum (Pt), for example. Surface acoustic wave resonator 2 may further include two reflectors provided on both sides of the IDT electrodes in a direction of propagation of a surface acoustic wave.

Multiple surface acoustic wave resonators 2 define a ladder filter. The size of each surface acoustic wave resonator 2 is determined according to predetermined filtering characteristics of the ladder filter. Features of surface acoustic wave resonator 2 are the same as or similar to those of general surface acoustic wave resonators, and thus description thereof will be omitted.

Line 3 includes a conductor layer preferably including, for example, Al, Cu, Ni, Au, or Pt, which is provided on primary surface 1a. At least one end of line 3 is connected to one of the interdigitated electrodes of surface acoustic wave resonator 2. Line 3 may be defined by multiple conductor layers.

Cover layer 5 is provided on support layer 4 described below, and faces primary surface 1a of piezoelectric substrate 1. Cover layer 5 preferably has a rectangular or substantially rectangular shape that is the same or substantially the same as primary surface 1a. Cover layer 5 includes an insulating material. For example, a resin such as epoxy or polyimide, or an insulating ceramic such as silicon oxide ($SiO_2$) or $Al_2O_3$ may preferably be used. Cover layer 5 may include multiple layers.

Support layer 4 is provided between piezoelectric substrate 1 and cover layer 5, and defines a hollow portion 11 that accommodates surface acoustic wave resonator 2, between piezoelectric substrate 1 and cover layer 5. Specifically, in order to provide hollow portion 11, support layer 4 that surrounds a region in which surface acoustic wave resonator 2 is provided on primary surface 1a.

As shown in FIG. 1, a portion of support layer 4 is located on the outer periphery of piezoelectric substrate 1. Due to the portion of support layer 4, hollow portion 11 is provided within the outer periphery of piezoelectric substrate 1. In the following description, the portion of support layer 4 that is located on the outer periphery of piezoelectric substrate 1 will be also referred to as "support layer 4".

Support layer 4 is preferably made of an insulating material, and, for example, a resin or an insulating ceramic can be used. Support layer 4 is preferably made of an insulating material (e.g., polyimide) that has excellent water resistance to prevent ingress of water into surface acoustic wave filter 100.

Line electrode 7 is provided on a second surface of cover layer 5 which is a surface opposite a first surface facing piezoelectric substrate 1. Line electrode 7 is connected to surface acoustic wave resonator 2 by a penetrating electrode not shown. Line electrode 7 defines a line pattern, for example, an inductor.

Connection electrode 6 is provided on the second surface of cover layer 5, extends to piezoelectric substrate 1 along side surfaces of cover layer 5 and side surfaces of support layer 4, and is connected to line 3 provided on piezoelectric substrate 1.

Protective layer 10, sealing support layer 4, cover layer 5, connection electrode 6, and line electrode 7 are provided on primary surface 1a of piezoelectric substrate 1. Protective layer 10 preferably has a rectangular or substantially rectangular shape that is the same or substantially the same as primary surface 1a. Protective layer 10 is preferably made of an insulating material, and, for example, a resin such as epoxy or polyimide, or an insulating ceramic such as silicon oxide ($SiO_2$) or $Al_2O_3$ can be used. Protective layer 10 may be made of the same or similar material as cover layer 5.

External connection terminal 9 is provided on protective layer 10. External connection terminal 9 is preferably, for example, a flat pad. The pad is a thin film preferably including an electrically conductive material, for example, Ti, Cu, Ni, or Au, etc. The pad may include multiple thin films. External connection terminal 9 overlaps with at least a portion of connection electrode 6 and a portion of line electrode 7 in plan view.

When mounting surface acoustic wave filter 100 onto a circuit board, external connection terminal 9 is connected to a line provided on the circuit board. External connection terminal 9 may be a bump. The bump is a metal bump, for example, a solder bump or an Au bump. Note that even when the external connection terminal is a bump, the bump overlaps with at least a portion of connection electrode 6 and a portion of line electrode 7 in plan view.

As shown in FIG. 1, pillar 8 extends through protective layer 10 in the thickness direction. One end portion of pillar 8 in the thickness direction of protective layer 10 is connected to external connection terminal 9, and the other end portion of pillar is connected to connection electrode 6 or line electrode 7. Pillar 8 is preferably made of a conductive material, for example, Ti or Cu. Pillar 8 may be formed of the same or similar conductive material as connection electrode 6, line electrode 7, and external connection terminal 9, or formed of any other conductive material.

Pillar 8 electrically connects external connection terminal 9, connection electrode 6, and line electrode 7. Pillar overlaps with external connection terminal 9, connection electrode 6, and line electrode 7 in plan as viewed in the thickness direction of protective layer 10.

Surface acoustic wave filter 100 shown in FIG. 1 is mounted on a circuit board while external connection terminal 9 is abutting a line provided on the circuit board. In other words, surface acoustic wave filter 100 is flip-chip mounted on the circuit board. Surface acoustic wave filter 100 and the circuit board define a "module" according to the present invention. In the first preferred embodiment, the module is preferably a WLP surface acoustic wave filter.

In surface acoustic wave filter 100, protective layer 10 includes a first portion 10a located above the hollow portion 11 (corresponding to "region I" in the figure) and a second portion 10b located above the support layer 4 (corresponding to "region II" in the figure). In other words, second portion 10b of protective layer 10 is located on the outer periphery of piezoelectric substrate 1.

Where d2 is a distance, in second portion 10b of protective layer 10, between the surface (primary surface 1a) of piezoelectric substrate 1 and the surface of protective layer 10 in the thickness direction of piezoelectric substrate 1, second portion 10b is disposed so that distance d2 is greatest at a location where second portion 10b is adjacent to or in a vicinity of first portion 10a, and distance d2 is shortest at a location where second portion 10b is adjacent to or in a vicinity of an end portion of piezoelectric substrate 1 in the width direction of piezoelectric substrate 1.

In surface acoustic wave filter 100 shown in FIG. 1, distance d2 decreases toward the end portions of piezoelectric substrate 1 in the width direction of piezoelectric substrate 1. In other words, the surface of second portion 10b is inclined from primary surface 1a of piezoelectric substrate 1 so that distance d2 is maximum at a location where second portion 10b is adjacent to or in a vicinity of region I and distance d2 is minimum at a location where second portion 10b is furthest away from region I.

Protective layer 10 further includes a curved surface in an end portion 10c in the width direction of piezoelectric substrate 1, the curved surface being convex in the opposite direction from the piezoelectric substrate 1. Accordingly, the end portions of the surface of protective layer 10 are not sharply squared.

Moreover, where d1 is a distance in first portion 10a of protective layer 10, between the surface (primary surface 1a) of piezoelectric substrate 1 and the surface of protective layer 10 in the thickness direction of piezoelectric substrate 1, the maximum value of distance d1 is greater than the maximum value of distance d2. According to this, the surface of first portion 10a is inclined from primary surface 1a of piezoelectric substrate 1.

More preferably, the surface of first portion 10a of protective layer 10 is convexly curved in the opposite direction from the piezoelectric substrate 1. According to this, the entirety or substantially the entirety of protective layer 10, including first portion 10a and second portion 10b, has a curved surface that is convex outwardly.

Next, a problem with a Comparative Example and advantageous effects of surface acoustic wave filter 100 according to the first preferred embodiment will be described, with reference to Comparative Example of the first preferred embodiment shown in FIGS. 2 and 3.

Figure 2:
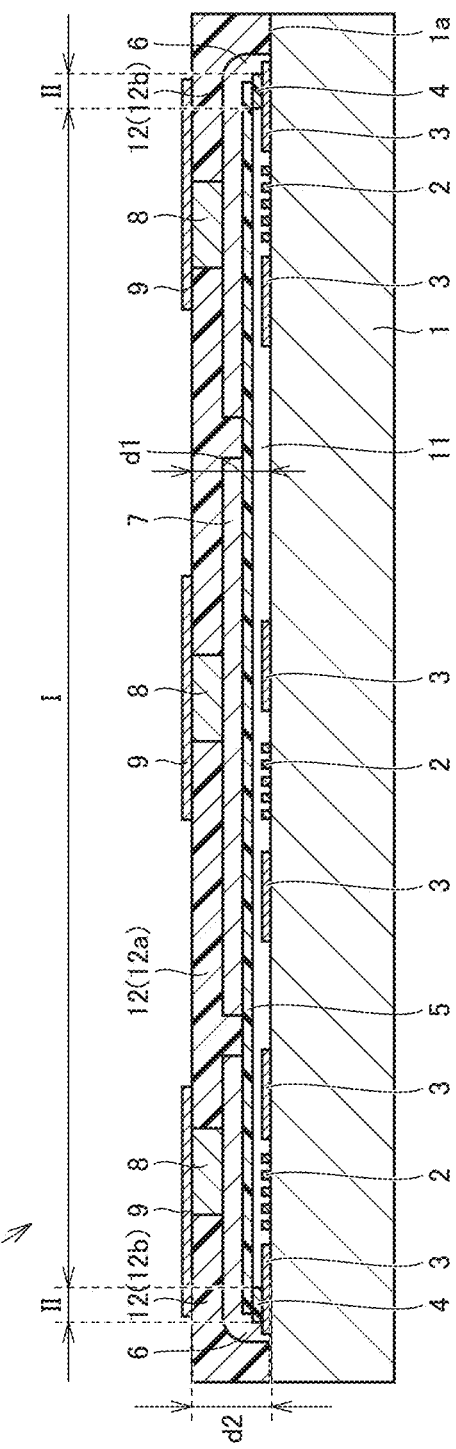
FIG. 2 is a cross-sectional view of a surface acoustic wave filter according to a Comparative Example.

FIG. 2 is a cross-sectional view of surface acoustic wave filter 200 according to Comparative Example, which is compared to FIG. 1.

Referring to FIG. 2, a surface acoustic wave filter 200 according to Comparative Example has similar features as surface acoustic wave filter 100 according to the first preferred embodiment shown in FIG. 1, except that surface acoustic wave filter 200 according to Comparative Example includes a protective layer 12, instead of protective layer 10 included in surface acoustic wave filter 100.

Specifically, in surface acoustic wave filter 200, protective layer 12 includes a first portion 12a located above a hollow portion 11 (a region I), and a second portion 12b located above a support layer 4 (a region II). In other words, second portion 12b of protective layer 12 is located on the outer periphery of piezoelectric substrate 1.

In second portion 12b, distance d2 between the surface (primary surface 1a) of piezoelectric substrate 1 and the surface of protective layer 12 in the thickness direction of piezoelectric substrate 1 is constant or substantially constant in the width direction of piezoelectric substrate 1. Stated differently, the surface of second portion 12b is in parallel with or substantially in parallel with primary surface 1a of piezoelectric substrate 1. For this reason, the surfaces of the end portions of protective layer 12 in the width direction of piezoelectric substrate 1 have square or substantially square shapes.

Moreover, in first portion 12a of protective layer 12, distance d1 between the surface (primary surface 1a) of piezoelectric substrate 1 and a surface of protective layer 12 in the thickness direction of piezoelectric substrate 1 is constant or substantially constant in the width direction of piezoelectric substrate 1. Stated differently, the surface of first portion 12a is in parallel with or substantially in parallel with primary surface 1a of piezoelectric substrate 1. In other words, in the entirely of protective layer 12, the distance between the surface (primary surface 1a) of piezoelectric substrate 1 and the surface of protective layer 12 in the thickness direction of piezoelectric substrate 1 is constant or substantially constant in the width direction of piezoelectric substrate 1.

Figure 3:
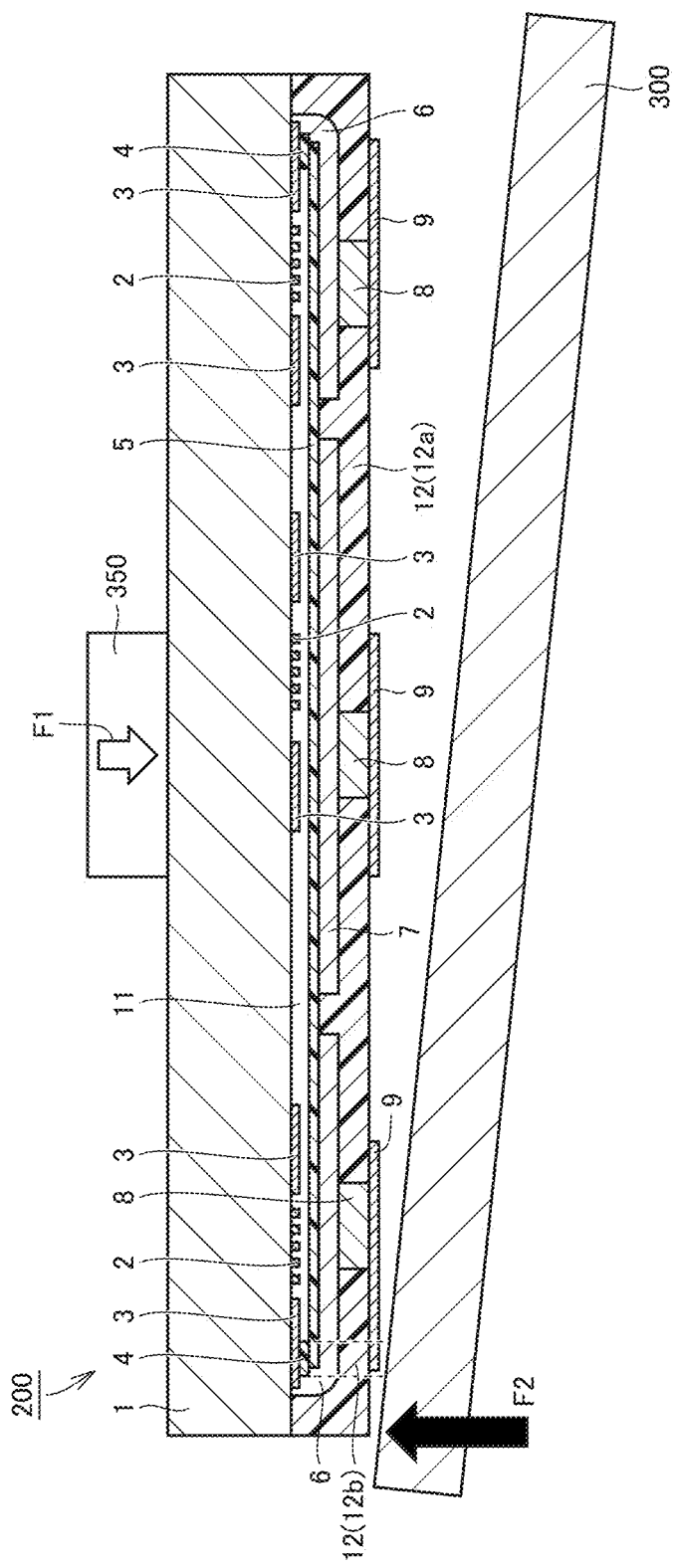
FIG. 3 is a diagram showing how the surface acoustic wave filter according to the Comparative Example is flip-chip mounted on a circuit board.

Surface acoustic wave filter 200 according to Comparative Example is flip-chip mounted on a circuit board 300, as shown in FIG. 3. In flip-chip mounting, surface acoustic wave filter 200 is picked up by suction of the rear surface of surface acoustic wave filter 200 (corresponding to the primary surface of piezoelectric substrate 1 opposite the primary surface 1a) by a mounter nozzle 350, and surface acoustic wave filter 200 is transferred over the circuit board 300. Surface acoustic wave filter 200 is then placed down onto circuit board 300, bringing external connection terminal 9 into contact with circuit board 300, thus mounting surface acoustic wave filter 200 in a predetermined location on circuit board 300.

Here, when bringing surface acoustic wave filter 200 into contact with circuit board 300, a stress F1 is applied to circuit board 300 downwardly in the thickness direction of surface acoustic wave filter 200. Surface acoustic wave filter 200 is subjected to a stress F2 as a reaction force against stress F1.

At this time, circuit board 300 may be inclined from primary surface 1a of piezoelectric substrate 1. If surface acoustic wave filter 200 is mounted on circuit board 300 while circuit board 300 is inclined, the end portion of a surface of protective layer 12 in the width direction thereof may come into contact with circuit board 300, as shown in FIG. 3. For this reason, stress F2 is applied by circuit board 300 to the end portion of the surface of protective layer 12.

In Comparative Example, since the end portions of the surface of protective layer 12 are square or substantially square, and thus stress F2 is concentrated onto the end portions. Thus, Comparative Example has the potential of causing damage to protective layer 12 at the end portions, for example, cracks and chips. As a portion of protective layer 12 is damaged, water or gas may enter protective layer 12 through the damaged portion, and connection electrode 6 and line electrode 7, etc., may be subjected to oxidation and corrosion. As a result, there is a concern that this may lead to degradation in filter characteristics of surface acoustic wave filter 200.

Moreover, in Comparative Example, circuit board 300 is required to have high coplanarity in order to prevent the damage to protective layer 12, which complicates the mount process.

Figure 4:
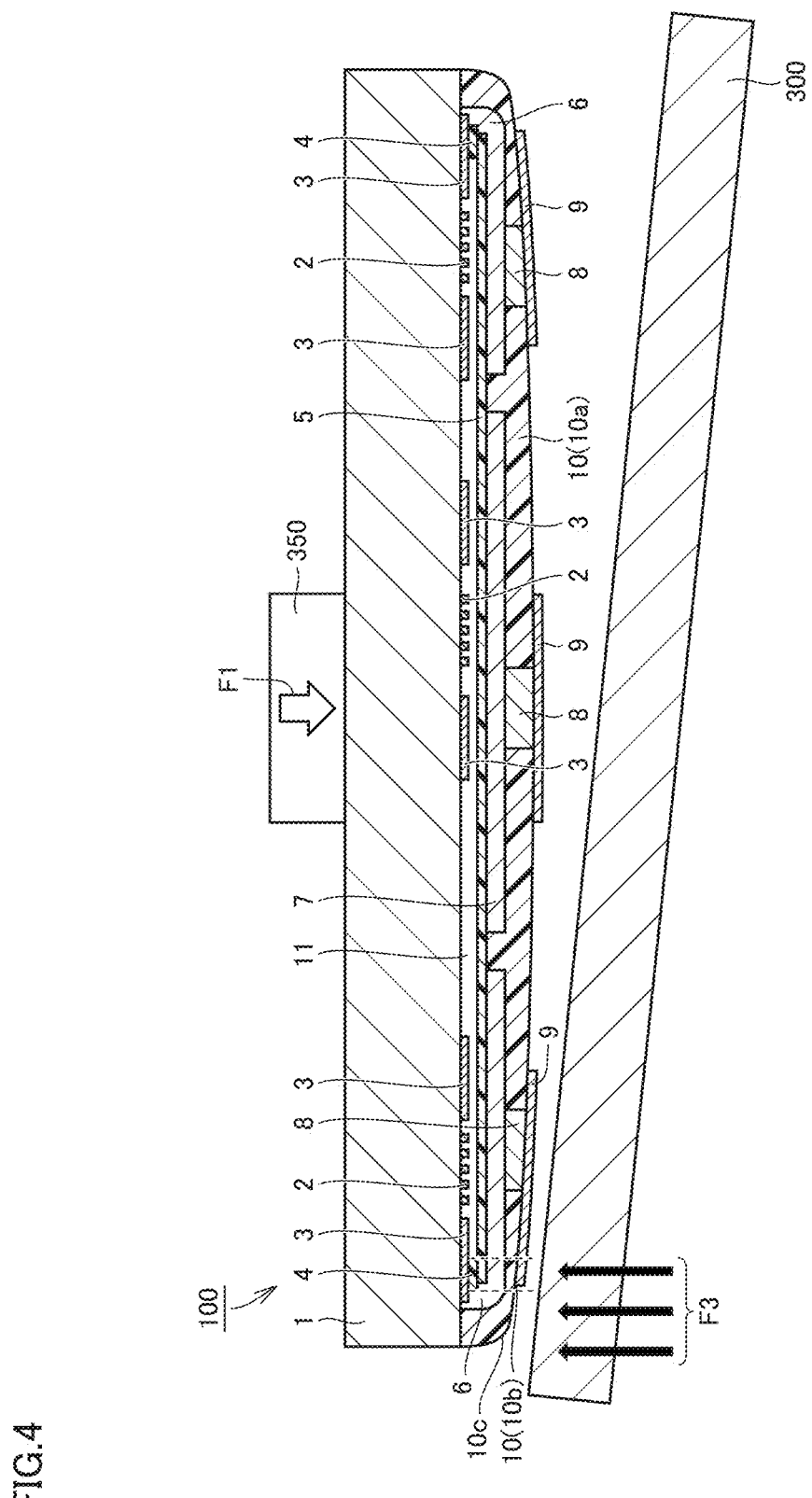
FIG. 4 is a diagram showing how the surface acoustic wave filter according to the first preferred embodiment of the present invention is flip-chip mounted on a circuit board.

FIG. 4 shows how surface acoustic wave filter 100 according to the first preferred embodiment is flip-chip mounted onto circuit board 300. In FIG. 4, circuit board 300 is inclined, as with FIG. 3. For this reason, an end portion of the surface of protective layer 10 comes into contact with circuit board 300.

In surface acoustic wave filter 100 according to the first preferred embodiment, the surface of second portion 10b is inclined from primary surface 1a of piezoelectric substrate 1 so that distance d2 is greatest at a location where second portion 10b is adjacent to or in a vicinity of region I and distance d2 is shortest at a location where second portion 10b is farthest away from region I. Furthermore, the surface of end portion 10c of protective layer 10 is convexly curved in the opposite direction from piezoelectric substrate 1, that is, end portion 10c is not sharply squared. For this reason, stress F3 by circuit board 300 is distributed and act on protective layer 10. Accordingly, the potential of damaging the end portion of protective layer 10 can be reduced. For this reason, oxidation and corrosion of connection electrode 6 and line electrode 7 resulting from the damage to protective layer 10 can be reduced, and, consequently, degradation in the filter characteristics can be reduced.

Moreover, since circuit board 300 is not required to have high coplanarity for mounting surface acoustic wave filter 100 onto circuit board 300, the mounting process is not complicated.

Note that while the first preferred embodiment has been described with reference to distance d2 in second portion 10b of protective layer 10 reducing toward the end portion of piezoelectric substrate 1 in the width direction of piezoelectric substrate 1, the present application is not limited to the above configuration, insofar as distance d2 is greatest at the location where second portion 10b is adjacent to or in a vicinity of first portion 10a and distance d2 is shortest at the location where second portion 10b is adjacent to or in a vicinity of the end portion of piezoelectric substrate 1 in the width direction of piezoelectric substrate 1, as described above. Accordingly, surface acoustic wave filter 100 according to the present invention also includes an implementation in which, for example, protective layer 10 has a surface that recedes into piezoelectric substrate 1 between the end portion of piezoelectric substrate 1 in the width direction of piezoelectric substrate 1 and the location where second portion 10b is adjacent or in a vicinity of to first portion 10a.

Furthermore, in surface acoustic wave filter 100 according to the first preferred embodiment, the following conditions are met for the shape of protective layer 10.

Figure 5A:
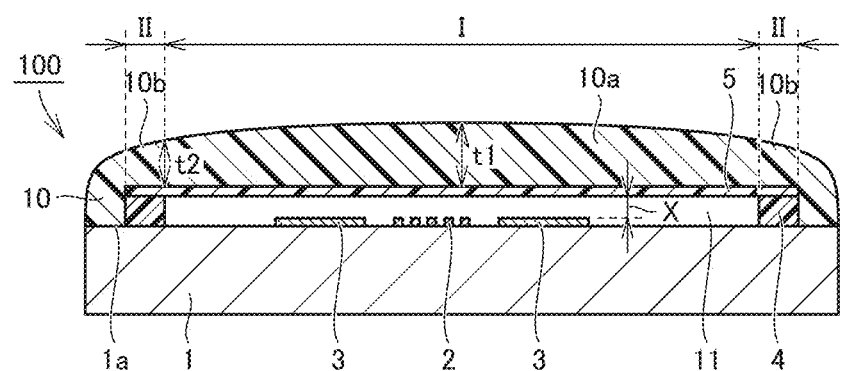
FIGS. 5A and 5B are cross-sectional views of the surface acoustic wave filter according to the first preferred embodiment of the present invention.
Figure 5B:
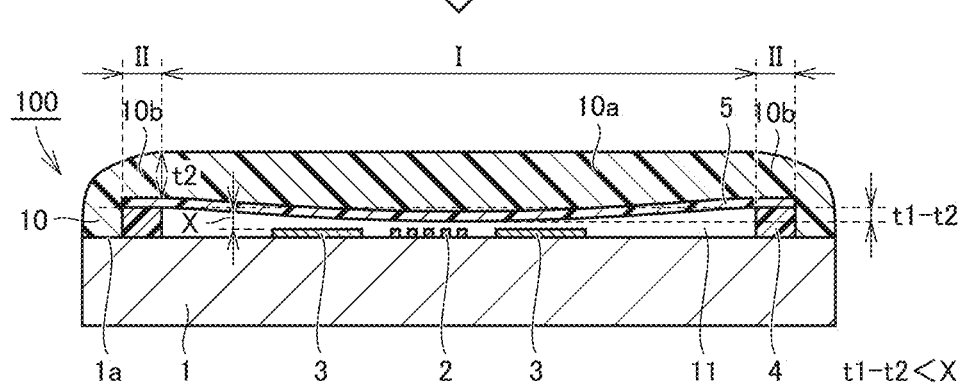

FIGS. 5A and 5B are cross-sectional views of surface acoustic wave filter 100 according to the first preferred embodiment. For ease of description, FIGS. 5A and 5B show only piezoelectric substrate 1, support layer 4, cover layer 5, and protective layer 10 of surface acoustic wave filter 100.

FIG. 5A is a cross-sectional view of surface acoustic wave filter 100 with no external stress applied to protective layer 10. FIG. 5B is a cross-sectional view of surface acoustic wave filter 100 with external stress applied to protective layer 10.

As described with reference to FIG. 1, the entirety of protective layer 10, including first portion 10a and second portion 10b, has a curved surface that is convex outwardly. In FIG. 5A, the distance between the surface of cover layer 5 and the surface of protective layer 10 in the thickness direction of piezoelectric substrate 1 is defined as a "thickness of protective layer 10." The thickness of protective layer 10 reduces from the center region of first portion 10a toward second portion 10b.

In FIG. 5A, t1 denotes the maximum thickness in first portion 10a (the maximum distance in first portion 10a, between the surface of cover layer 5 and the surface of protective layer 10 in the thickness direction of piezoelectric substrate 1), and t2 denotes the maximum thickness in second portion 10b (the maximum distance in second portion 10b, between the surface of cover layer 5 and the surface of protective layer 10 in the thickness direction of piezoelectric substrate 1). Moreover, X denotes the minimum distance in hollow portion 11, between the surface of cover layer 5 facing hollow portion 11 (a surface opposite the surface facing protective layer 10) and the surfaces of surface acoustic wave resonator 2 and line 3, in the thickness direction of piezoelectric substrate 1.

Here, when mounting surface acoustic wave filter 100 onto circuit board 300, surface acoustic wave filter 100 is pushed against circuit board 300. Thus, protective layer 10 receives a pressure from circuit board 300 in the thickness direction, as a reaction force.

At this time, upon receipt of the pressure from circuit board 300, protective layer 10 is pushed, preferentially, from the central region of first portion 10a. Initially, the contact area between circuit board 300 and the surface of protective layer 10 is small, and deformation of protective layer 10 is also small. However, as the pressure increases, protective layer 10 is further deformed, increasing the contact area between circuit board 300 and the surface of protective layer 10.

At this time, the rear surface of protective layer 10 deforms convexly in the direction to piezoelectric substrate 1. As the rear surface of protective layer 10 deforms, cover layer 5 deforms convexly in the direction to piezoelectric substrate 1.

Thereafter, as the protective layer 10 deforms to the border between first portion 10a and second portion 10b, protective layer 10 becomes less likely to deform, as shown in FIG. 5B. This is because the end portions of protective layer 10 in the thickness direction are supported by support layer 4, and the rigidity of protective layer 10 is increased by a compressive stress caused in protective layer 10.

In FIG. 5B, the upper limit of the distance between the highest point and the lowest point of the convexly curved rear surface of cover layer 5 in the thickness direction thereof can be represented as a difference (t1−t2) between the maximum thickness t1 of first portion 10a and maximum thickness t2 of second portion 10b.

Note that the highest point refers to a region of the convex rear surface of cover layer 5 that is closest to piezoelectric substrate 1 (e.g., the central region of the convexly curved rear surface). The lowest point refers to a region of the convex rear surface of cover layer 5 that is farthest away from piezoelectric substrate 1 (e.g., end regions of the convexly curved rear surface).

Here, in surface acoustic wave filter 100, maximum thickness t1 of first portion 10a, maximum thickness t2 of second portion 10b, and minimum distance X of hollow portion 11 satisfy the relational expression expressed as $(t1-t2)<X$.

In this way, a gap is provided between the rear surface of cover layer 5 and the surface of surface acoustic wave resonator 2 or line 3 even if protective layer 10 is deformed farthest. This can prevent the rear surface of cover layer 5 from contacting with surface acoustic wave resonator 2 or line 3, and thus prevent damage to surface acoustic wave resonator 2 and line 3. Accordingly, the deterioration can be reduced in the filter characteristics of surface acoustic wave filter 100.

Note that line electrode 7 is provided between first portion 10a of protective layer 10 and cover layer 5, as shown in FIG. 1. This allows protective layer 10 to have increased rigidly against the pressure from circuit board 300.

Variation of First Preferred Embodiment

Next, referring to FIG. 6, surface acoustic wave filter 100 according to a variation of the first preferred embodiment will be described.

Figure 6:
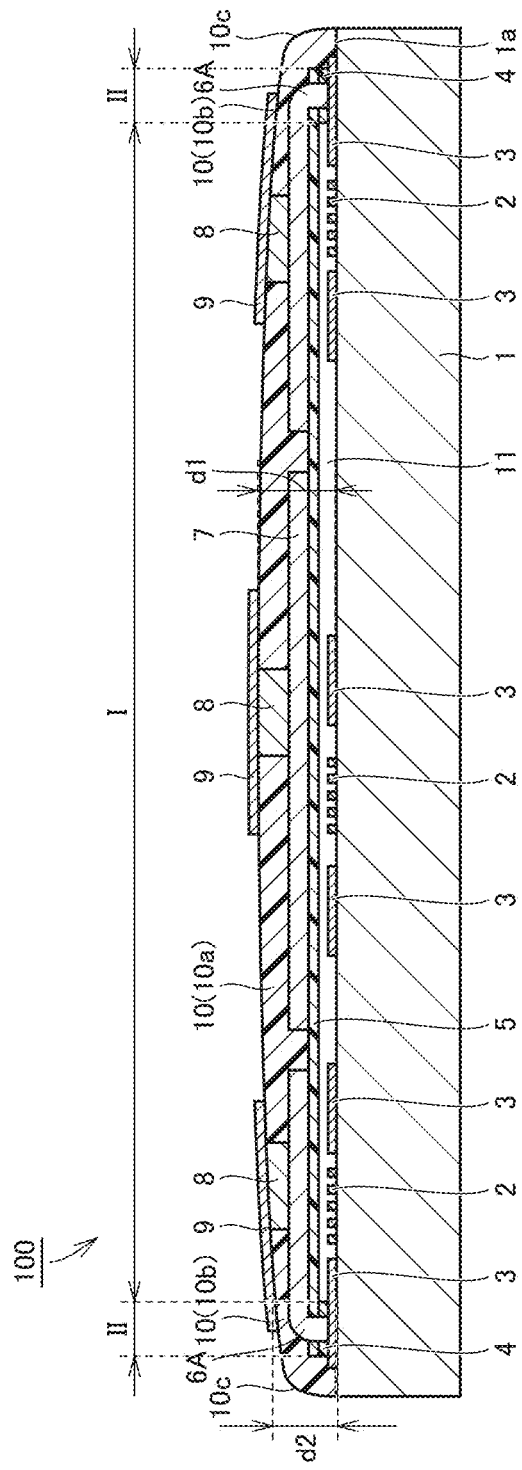
FIG. 6 is a cross-sectional view of a surface acoustic wave filter according to a variation of the first preferred embodiment of the present invention.

As shown in FIG. 6, surface acoustic wave filter 100 according to the variation has similar features as surface acoustic wave filter 100 shown in FIG. 1, except that surface acoustic wave filter 100 according to the variation includes a penetrating electrode 6A, instead of connection electrode 6.

In surface acoustic wave filter 100 according to the present variation, penetrating electrode 6A is provided through cover layer 5 and support layer 4. Penetrating electrode 6A and pillar 8 electrically connect external connection terminal 9 and line 3 which are respectively provided on protective layer 10 and piezoelectric substrate 1.

Even though line 3 and external connection terminal 9 are electrically connected using penetrating electrode 6A as in the present variation, the surface of second portion 10b of protective layer 10 is inclined from primary surface 1a of piezoelectric substrate 1 so that distance d2 is greatest at a location where second portion 10b is adjacent to or in a vicinity of region I and distance d2 is shortest at a location where second portion 10b is farthest away from region I, similarly to the first preferred embodiment described above. Furthermore, end portion 10c of protective layer 10 has a curved surface that is convex in the opposite direction from piezoelectric substrate 1. Due to this, the potential of damaging protective layer 10 can be reduced. Accordingly, oxidation and corrosion of an external connection line resulting from the damage to protective layer 10 can be reduced, and, consequently, degradation in the filter characteristics can be reduced.

Second Preferred Embodiment

Figure 7:
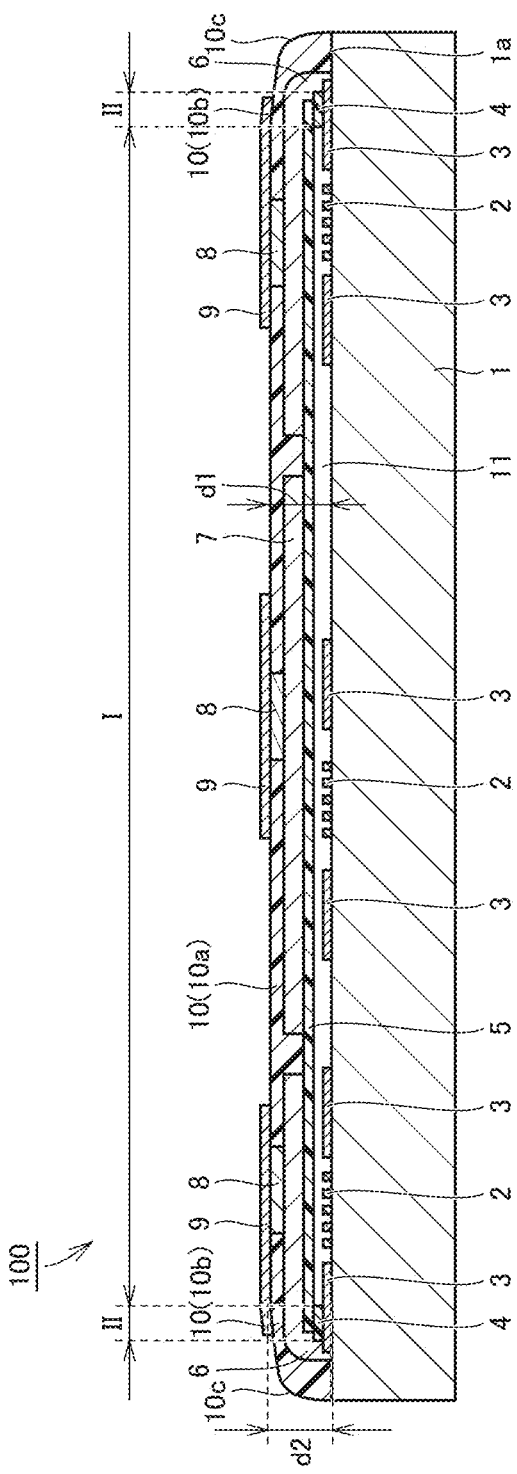
FIG. 7 is a cross-sectional view of a surface acoustic wave filter according to a second preferred embodiment of the present invention.

Referring to FIG. 7, an electronic device 100 according to a second preferred embodiment of the present invention will be described.

Referring to FIG. 7, a surface acoustic wave filter 100 according to the second preferred embodiment has similar features as surface acoustic wave filter 100 shown in FIG. 1, except for the features of a protective layer 10.

Protective layer 10 of surface acoustic wave filter 100 shown in FIG. 7 has a first portion 10a having a flat surface. Note that first portion 10a including a flat surface includes distance d1, in first portion 10a, between the surface (primary surface 1a) of a piezoelectric substrate 1 and a surface of protective layer 10 in the thickness direction of piezoelectric substrate 1, as being not only constant, but also substantially constant in the width direction of piezoelectric substrate 1. Distance d1 as being substantially constant in the width direction of piezoelectric substrate 1 means that distance d1 varies within an extent of error (e.g., within plus or minus 10%).

The surface of second portion 10b of protective layer 10 in surface acoustic wave filter 100 according to the second preferred embodiment is also inclined from primary surface 1a of piezoelectric substrate 1 so that distance d2 is maximum at a location where second portion 10b is adjacent to or in a vicinity of region I and distance d2 is minimum at a location where second portion 10b is farthest away from region I. Furthermore, end portion 10c of protective layer 10 has a curved surface that is convex in the opposite direction from piezoelectric substrate 1. Accordingly, similarly to surface acoustic wave filter 100 according to the first preferred embodiment, the potential of damaging protective layer 10 can be reduced. Accordingly, oxidation and corrosion of a connection electrode 6 and a line electrode 7 resulting from the damage to protective layer 10 can be reduced, and, consequently, degradation in the filter characteristics can be reduced.

Third Preferred Embodiment

Figure 8:
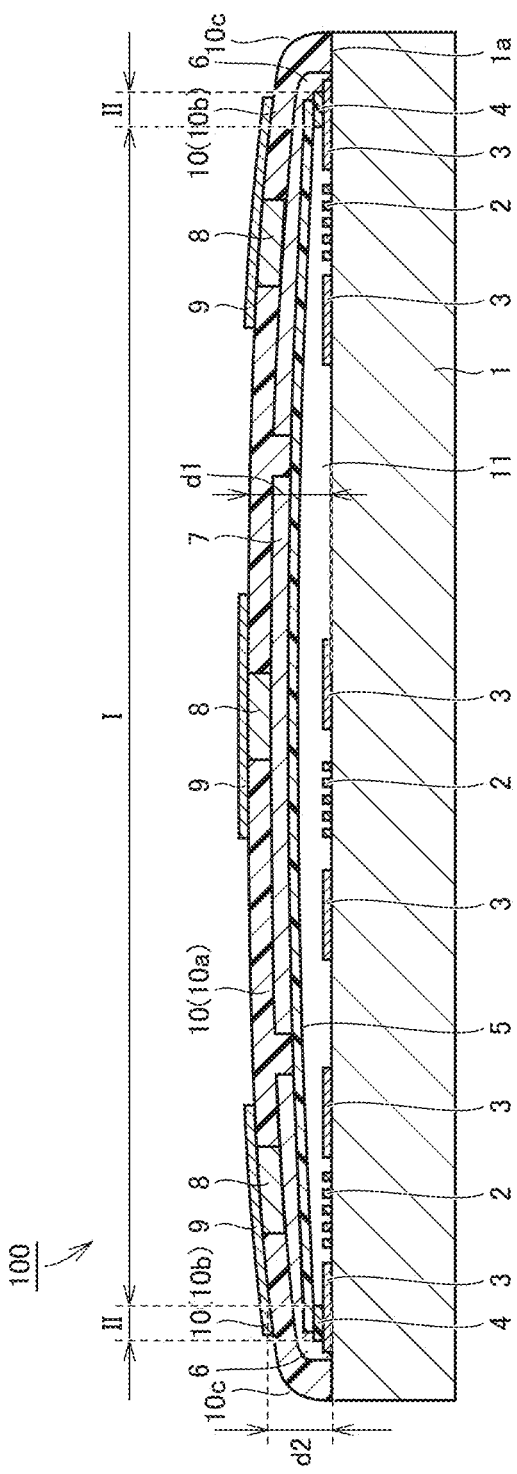
FIG. 8 is a cross-sectional view of a surface acoustic wave filter according to a third preferred embodiment of the present invention.

Referring to FIG. 8, an electronic device 100 according to a third preferred embodiment of the present invention will be described.

Referring to FIG. 8, electronic device 100 according to the third preferred embodiment basically has similar features as surface acoustic wave filter 100 shown in FIG. 1, except for the features of a cover layer 5.

In surface acoustic wave filter 100 shown in FIG. 8, cover layer 5 includes a curved portion that is convex in the opposite direction from a piezoelectric substrate 1.

While FIG. 8 shows cover layer 5 as having a single curved portion, it should be noted that cover layer 5 may have multiple curved portions. For example, in an implementation in which a support layer 4 is provided in a hollow portion 11, cover layer 5 is divided into two portions at the connection between support layer 4 and cover layer 5, one portion being on one side in the width direction, the other portion being on the other side in the width direction, each of which portions is curved convexly in the opposite direction from piezoelectric substrate 1.

Surface acoustic wave filter 100 according to the third preferred embodiment includes a second portion 10b of a protective layer 10 which has the same or similar features as that of surface acoustic wave filter 100 according to the first preferred embodiment. Accordingly, surface acoustic wave filter 100 according to the third preferred embodiment can provide the same or similar advantageous effects as those of surface acoustic wave filter 100 according to the first preferred embodiment.

Fourth Preferred Embodiment

Figure 9:
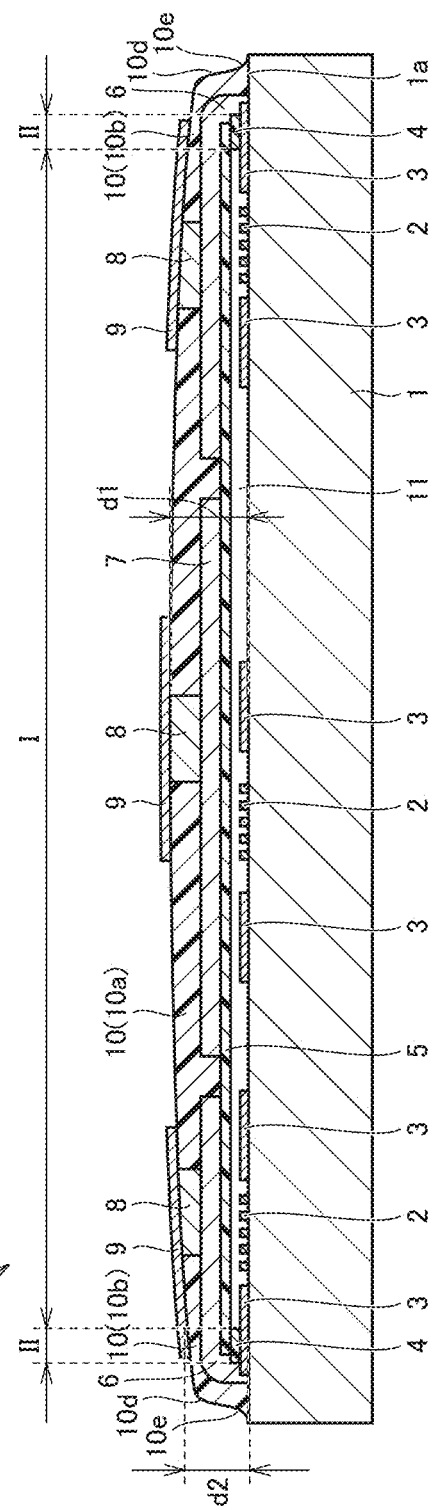
FIG. 9 is a cross-sectional view of a surface acoustic wave filter according to a fourth preferred embodiment of the present invention.
Figure 10:
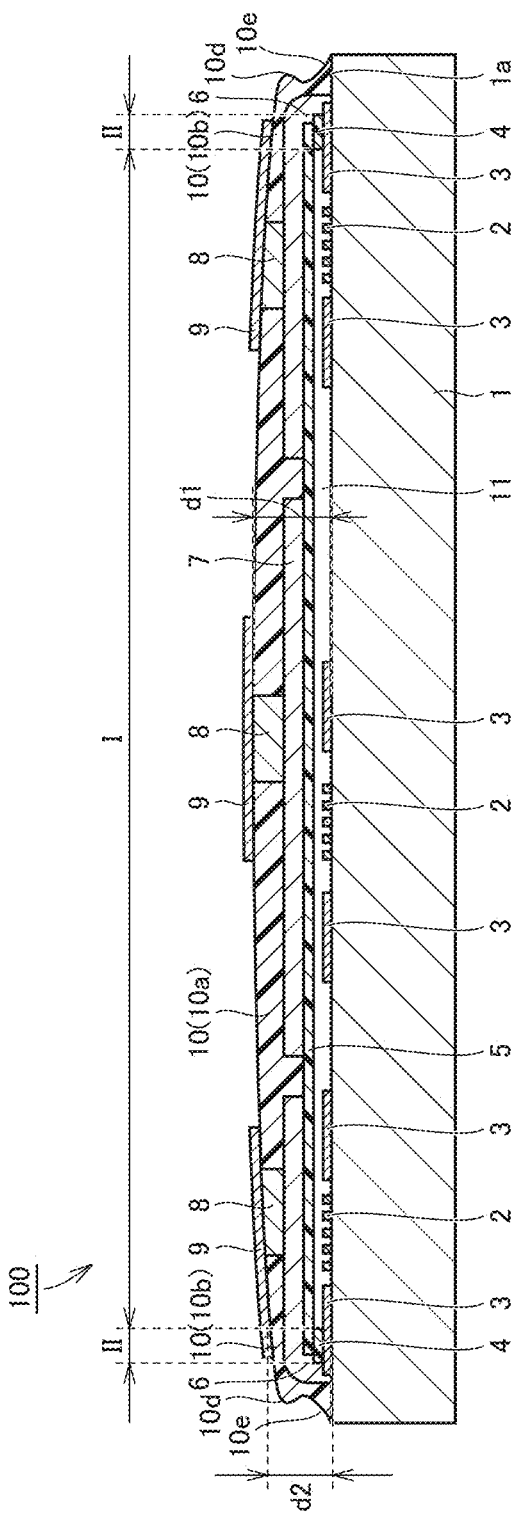
FIG. 10 is a cross-sectional view of a surface acoustic wave filter according to a variation of the fourth preferred embodiment of the present invention.

Referring to FIGS. 9 and 10, an electronic device 100 according to a fourth preferred embodiment of the present invention will be described.

Referring to FIG. 9, a surface acoustic wave filter 100 according to the fourth preferred embodiment has similar features as surface acoustic wave filter 100 shown in FIG. 1, except for the features of a protective layer 10.

In surface acoustic wave filter 100 shown in FIG. 9, protective layer 10 includes a first curved portion 10d at an end portion of piezoelectric substrate 1 in the width direction, and a second curved portion 10e between first curved portion 10d and an end surface of piezoelectric substrate 1 in the width direction. First curved portion 10d is convex in the opposite direction from piezoelectric substrate 1. In contrast, second curved portion 10e is concave in the direction to piezoelectric substrate 1.

Compared to surface acoustic wave filter 100 shown in FIG. 1, surface acoustic wave filter 100 according to the fourth preferred embodiment has an increased bond area between protective layer 10 and primary surface 1a of piezoelectric substrate 1, due to second curved portion 10e. However, since the thickness of second curved portion 10e decreases toward the end portion of piezoelectric substrate 1, protective layer 10, which covers the end portion of piezoelectric substrate 1 in the width direction, is moderated from significantly increasing in volume that is due to the provision of second curved portion 10e.

According to surface acoustic wave filter 100 of the fourth preferred embodiment, the bond area between primary surface 1a and protective layer 10 at the end portion of piezoelectric substrate 1 in the width direction can be increased while preventing an increase in volume of protective layer 10. An increase in the bond area between primary surface 1a and protective layer 10 increases the bonding strength, thus preventing protective layer 10 from being debonded from primary surface 1a when the end portion of the surface of protective layer 10 in the width direction comes into contact with the circuit board 300.

FIG. 10 shows a variation of surface acoustic wave filter 100 according to the fourth preferred embodiment. Also in the present variation, protective layer 10 includes a first curved portion 10d at an end portion of piezoelectric substrate 1 in the width direction, and a second curved portion 10e between first curved portion 10d and an end surface of piezoelectric substrate 1 in the width direction. Thus, the present variation of surface acoustic wave filter 100 according to the fourth preferred embodiment can provide the same or similar advantageous effects as those of surface acoustic wave filter 100 shown in FIG. 9.

Fifth Preferred Embodiment

Figure 11:
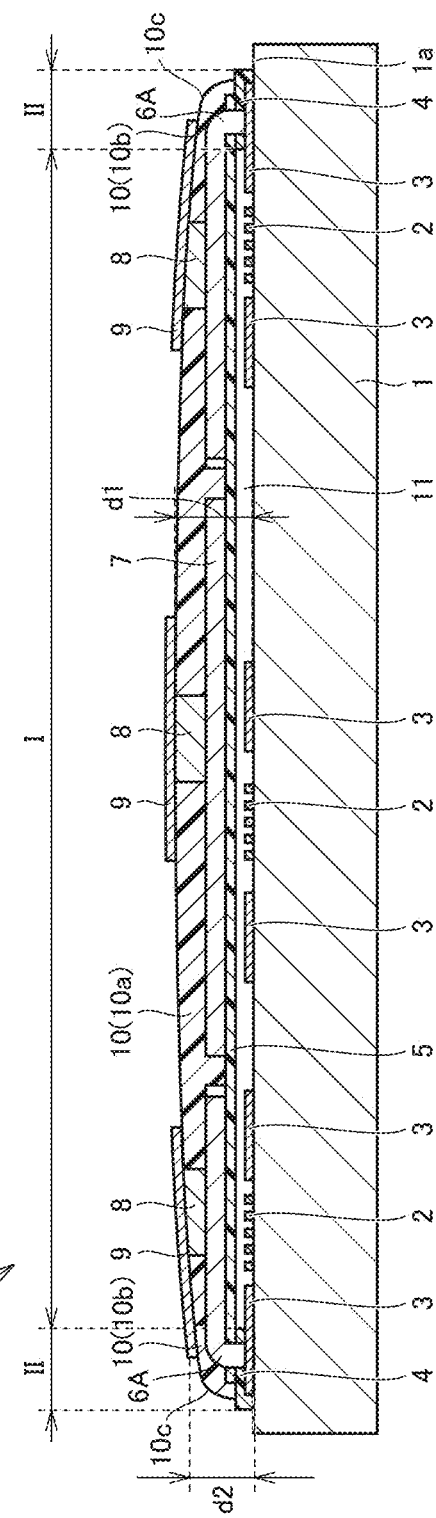
FIG. 11 is a cross-sectional view of a surface acoustic wave filter according to a fifth preferred embodiment of the present invention.
Figure 12:
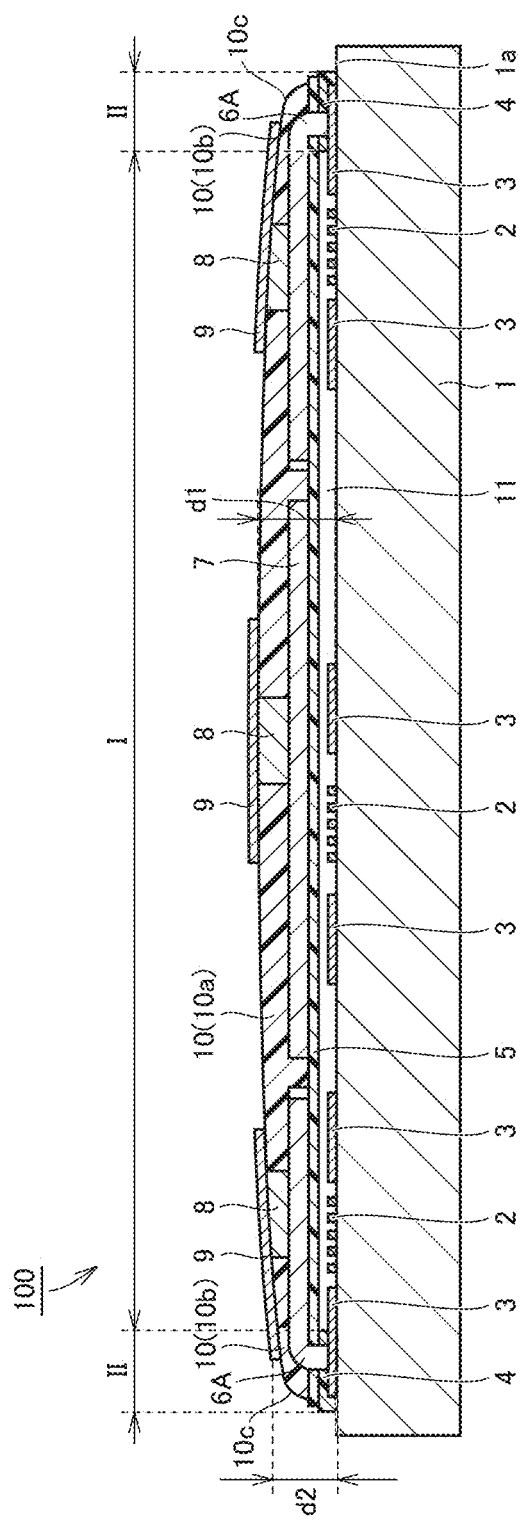
FIG. 12 is a cross-sectional view of a surface acoustic wave filter according to the fifth preferred embodiment of the present invention.

Referring to FIGS. 11 and 12, an electronic device 100 according to a fifth preferred embodiment will be described.

Referring to FIG. 11, a surface acoustic wave filter 100 according to the fifth preferred embodiment has similar features as surface acoustic wave filter 100 according to the variation of the first preferred embodiment shown in FIG. 6, except for the features of a support layer 4 and a protective layer 10.

In surface acoustic wave filter 100 shown in FIG. 11, a penetrating electrode 6A is provided through a cover layer 5 and a support layer 4. An end surface of support layer 4 in the width direction is located outward of the end surface of protective layer 10 in the width direction (on the end surface side of piezoelectric substrate 1 in the width direction). Note that the end surface of protective layer 10 in the width direction is located outward of the end surface of cover layer 5 in the width direction.

Compared to surface acoustic wave filter 100 shown in FIG. 6, surface acoustic wave filter 100 according to the fifth preferred embodiment includes end portion 10c of protective layer 10 in the width direction located farther away from the end surface of piezoelectric substrate 1 in the width direction. Thus, when mounting surface acoustic wave filter 100 onto circuit board 300 (see FIG. 4), the potential of the surface of end portion 10c of protective layer 10 coming into contact with circuit board 300, can be reduced. Accordingly, the potential of damaging protective layer 10 can further be reduced.

FIG. 12 is a diagram showing a variation of surface acoustic wave filter 100 according to the fifth preferred embodiment. Also in the present variation, the end surface of support layer 4 in the width direction is located outward of the end surface of protective layer 10 in the width direction. Note that FIG. 12 shows the end surface of cover layer 5 in the width direction that is located outward of the end surface of protective layer 10 in the width direction. The variation can also yield the same or similar advantageous effects as those of surface acoustic wave filter 100 shown in FIG. 11.

Sixth Preferred Embodiment

Figure 13:
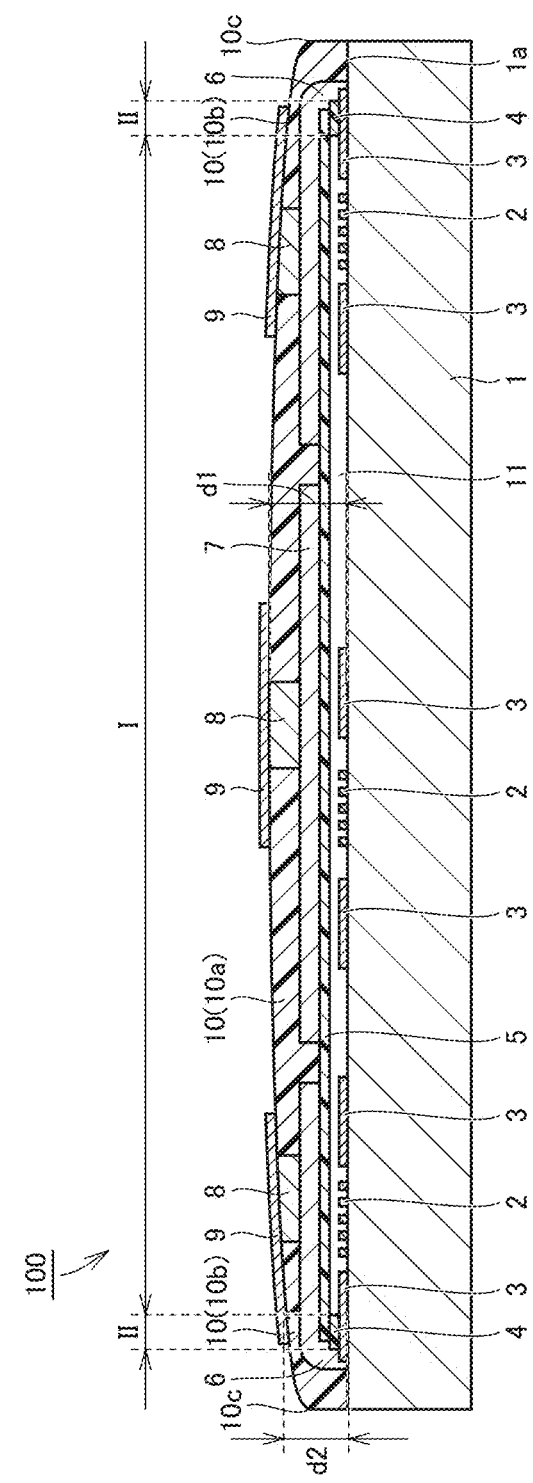
FIG. 13 is a cross-sectional view of a surface acoustic wave filter according to a sixth preferred embodiment of the present invention.

Referring to FIG. 13, an electronic device 100 according to a sixth preferred embodiment of the present invention will be described.

Referring to FIG. 13, a surface acoustic wave filter 100 according to the sixth preferred embodiment has similar features as surface acoustic wave filter 100 shown in FIG. 1, except for the features of a protective layer 10.

In surface acoustic wave filter 100 shown in FIG. 13, end portion 10c of protective layer 10 does not have a curved surface that is convex in the opposite direction from piezoelectric substrate 1. However, the surface of second portion 10b of protective layer 10 in surface acoustic wave filter 100 according to the sixth preferred embodiment is also inclined from primary surface 1a of piezoelectric substrate 1 so that distance d2 is maximum at a location where second portion 10b is adjacent to or in a vicinity of region I and distance d2 is minimum at a location where second portion 10b is farthest away from region I. Accordingly, similarly to surface acoustic wave filter 100 according to the first preferred embodiment, the potential of damaging protective layer 10 can be reduced. Accordingly, oxidation and corrosion of a connection electrode 6 and a line electrode 7 resulting from the damage to protective layer 10 can be reduced, and, consequently, degradation in the filter characteristics can be reduced.

The presently disclosed embodiments should be considered in all aspects as illustrative and not restrictive. The scope of the present invention is defined by the appended claims, rather than by the description above. All changes which come within the meaning and range of equivalency of the appended claims are to be embraced within their scope.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic device, comprising:
   a piezoelectric substrate;
   a functional element provided on the piezoelectric substrate;
   a support layer surrounding the functional element;
   a cover layer provided on the support layer, the cover layer facing the piezoelectric substrate; and
   a protective layer sealing the support layer and the cover layer; wherein
   the piezoelectric substrate, the support layer, and the cover layer define a hollow portion that accommodates the functional element;
   the support layer defines the hollow portion inside an outer periphery of the piezoelectric substrate by being provided on at least the outer periphery of the piezoelectric substrate;
   the protective layer includes a first portion above the hollow portion, a second portion above the support layer; and
   a distance between a surface of the piezoelectric substrate and a surface of the protective layer in a thickness direction of the piezoelectric substrate is greatest at a location where the second portion is adjacent to or in a vicinity of the first portion, and the distance is shortest at a location where the second portion is adjacent to or in a vicinity of an end portion of the piezoelectric substrate in a width direction.

2. The electronic device according to claim 1, wherein the distance decreases toward the end portion of the piezoelectric substrate in the width direction.

3. The electronic device according to claim 1, wherein a maximum distance in the thickness direction, between the surface of the piezoelectric substrate and the surface of the protective layer in the first portion is greater than a maximum distance in the thickness direction, between the surface of the piezoelectric substrate and the surface of the protective layer in the second portion.

4. The electronic device according to claim 1, wherein the first portion of the protective layer includes a curved surface that is convex in an opposite direction from the piezoelectric substrate.

5. The electronic device according to claim 1, wherein
   a maximum distance t1, a maximum distance t2, and a minimum distance X satisfy a relational expression expressed as (t1−t2)<X,
   where t1 denotes a maximum distance in the thickness direction, between a surface of the cover layer and the surface of the protective layer in the first portion, t2 denotes a maximum distance in the thickness direction, between the surface of the cover layer and the surface of the protective layer in the second portion, and X denotes a minimum distance in the thickness direction, between the surface of the cover layer facing the hollow portion and a surface of the functional element in the hollow portion.

6. The electronic device according to claim 1, wherein the first portion of the protective layer includes a flat surface.

7. The electronic device according to claim 1, wherein the cover layer includes a curved portion that is convex in an opposite direction from the piezoelectric substrate.

8. The electronic device according to claim 1, wherein at the end portion of the piezoelectric substrate in the width direction, the protective layer includes:

a first curved portion which is convex in an opposite direction from the piezoelectric substrate; and a second curved portion which is concave in a direction to the piezoelectric substrate, the second curved portion being located between the first curved portion and an end surface of the piezoelectric substrate in the width direction.

9. The electronic device according to claim 1, wherein an end surface of the support layer in the width direction is located outward of an end surface of the protective layer in the width direction.

10. The electronic device according to claim 1, further comprising:

a line provided on the piezoelectric substrate and connected to the functional element; and a connection electrode provided on the cover layer, the connection electrode extending to the piezoelectric substrate along the support layer and side surfaces of the cover layer, and connected to the line.

11. The electronic device according to claim 10, further comprising:

an external connection terminal provided on the protective layer; wherein the external connection terminal overlaps with at least a portion of the connection electrode in plan view.

12. The electronic device according to claim 11, further comprising:

a pillar that extends through the protective layer in the thickness direction; wherein a first end portion of the pillar in the thickness direction is connected to the external connection terminal;

a second end portion of the pillar in the thickness direction is connected to the connection electrode; and the pillar includes a conductive material.

13. The electronic device according to claim 1, further comprising:

a line provided on the piezoelectric substrate and connected to the functional element; and a penetrating electrode connected to the line, the penetrating electrode extending through the support layer and the cover layer.

14. The electronic device according to claim 1, further comprising a line electrode provided between the first portion of the protective layer and the cover layer.

15. A module, comprising:

a circuit board including a line provided at least on a surface of the circuit board; and the electronic device according to claim 1, the electronic device being flip-chip mounted on the circuit board.

16. The electronic device according to claim 1, wherein the protective layer includes a curved surface that is convex in an opposite direction from the piezoelectric substrate, the curved surface being at an end portion of the piezoelectric substrate in a width direction of the piezoelectric substrate.

17. The electronic device according to claim 1, wherein the functional element is a surface acoustic wave resonator.

18. The electronic device according to claim 1, wherein the functional element is one of a plurality of acoustic wave resonators that define a ladder filter.

19. The electronic device according to claim 1, wherein the support layer includes a first insulating material; and the cover layer includes a second insulating material.

* * * * *